United States Patent
Joo et al.

(10) Patent No.: US 9,461,656 B2
(45) Date of Patent: Oct. 4, 2016

(54) INJECTION-LOCKED PHASE LOCKED LOOP CIRCUITS USING DELAY LOCKED LOOPS

(71) Applicant: Samsung Electronics Co., Ltd., Suwon-Si, Gyeonggi-Do (KR)

(72) Inventors: Hye-Yoon Joo, Seoul (KR); Seung-Jun Bae, Hwaseong-si (KR); Young-Soo Sohn, Seoul (KR); Ho-Sung Song, Seoul (KR); Jeong-Don Ihm, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 4 days.

(21) Appl. No.: 14/558,072

(22) Filed: Dec. 2, 2014

(65) Prior Publication Data

US 2015/0213873 A1 Jul. 30, 2015

(30) Foreign Application Priority Data

Jan. 28, 2014 (KR) ........................ 10-2014-0010767

(51) Int. Cl.
| | |
|---|---|
| *H03L 7/06* | (2006.01) |
| *H03L 7/087* | (2006.01) |
| *H03L 7/07* | (2006.01) |
| *H03L 7/083* | (2006.01) |
| *H03L 7/099* | (2006.01) |
| *G11C 7/22* | (2006.01) |

(52) U.S. Cl.
CPC .................. *H03L 7/087* (2013.01); *H03L 7/07* (2013.01); *H03L 7/083* (2013.01); *H03L 7/0995* (2013.01); *G11C 7/222* (2013.01)

(58) Field of Classification Search
None
See application file for complete search history.

(56) References Cited

U.S. PATENT DOCUMENTS

| 6,859,109 B1 | 2/2005 | Leung et al. |
| 7,019,573 B2 | 3/2006 | Matsuno |

(Continued)

FOREIGN PATENT DOCUMENTS

| KR | 10-2009-0070129 A | 7/2009 |
| KR | 10-0929825 B1 | 12/2009 |

OTHER PUBLICATIONS

J. Lee, "Study of Subharmonically Injection-Locked Phase-Locked loops", published in Solid-State Circuits, IEEE J., May 5, 2009, 15pgs, vol. 44.

(Continued)

*Primary Examiner* — Cassandra Cox
(74) *Attorney, Agent, or Firm* — Harness, Dickey & Pierce, P.L.C.

(57) ABSTRACT

An injection-locked phase-locked loop (ILPLL) circuit includes a delay-locked loop (DLL) and an ILPLL. The DLL is configured to generate a DLL clock by performing a delay-locked operation on a reference clock. The ILPLL includes a voltage-controlled oscillator (VCO), and is configured to generate an output clock by performing an injection synchronous phase-locked operation on the reference clock. The DLL clock is injected into the VCO as an injection clock of the VCO.

20 Claims, 8 Drawing Sheets

(56) References Cited

U.S. PATENT DOCUMENTS

| | | | |
|---|---|---|---|
| 7,952,438 B2 | 5/2011 | Song et al. | |
| 8,432,198 B2* | 4/2013 | Liang | H03L 7/23 327/147 |
| 8,841,948 B1* | 9/2014 | Chien | H03L 7/07 327/149 |
| 2006/0197614 A1 | 9/2006 | Roubadia et al. | |
| 2007/0064850 A1* | 3/2007 | Tamura | H04L 7/033 375/355 |
| 2010/0259305 A1 | 10/2010 | Lee et al. | |
| 2012/0062293 A1 | 3/2012 | Liang et al. | |
| 2012/0161827 A1* | 6/2012 | Madeira | G06F 1/06 327/147 |

OTHER PUBLICATIONS

J. Lee, A 20-Gb/s Burst-Mode Clock and Date Recovery Circuit Using Injection-Locking Technique, published in IEEE J., Solid-State Circuits, Mar. 2008, 12 pgs, vol. 43.

J. Lee. "A 20-Gb/s Burst-Mode Clock and Date Recovery Circuit Using Injection-Locking Technique", published in IEEE International Solid-State Circuits Conference, Digest of Technical Papers on Feb. 12, 2007, 3 pgs.

* cited by examiner

| PWDN | ILPLL_EN | CLKout |
|------|----------|--------|
| H | L | OFF |
| L | H | ON |

INJECTION-LOCKED PHASE LOCKED LOOP CIRCUITS USING DELAY LOCKED LOOPS

CROSS-REFERENCE TO RELATED APPLICATION(S)

This application claims priority under 35 U.S.C. §119 to Korean Patent Application No. 10-2014-0010767 filed on Jan. 28, 2014, the disclosure of which is hereby incorporated by reference in its entirety.

BACKGROUND

1. Field

Example embodiments of inventive concepts relate to injection-locked phase-locked loop (ILPLL) circuits, and more particularly, to ILPLL circuits using delay-locked loops (DLLs).

2. Description of Related Art

In a conventional source-synchronous system such as a dynamic random access memory (DRAM), an injection-locked phase-locked loop (ILPLL) is used to increase a correlation between a clock and data through a jitter tracking mechanism, and to reduce phase noise of a voltage-controlled oscillator (VCO).

However, since the lock failure of an ILPLL often depends on a phase of an injection signal, the phase of the injection signal must be locked without being affected by changes in process, voltage, temperature, etc.

For example, when a phase difference between an injection signal injected to the VCO of the ILPLL (e.g., an injection clock) and an output signal of the VCO of the ILPLL (e.g., an output clock) exceeds a maximum phase difference, in which an injection lock determined by a jitter tracking bandwidth required in a system, occurs, a number of frequency tones appear in the output clock of the VCO.

SUMMARY

Some example embodiments of inventive concepts provide injection-locked phase-locked loops (ILPLLs) in which a phase of an injection signal injected into a voltage-controlled oscillator (VCO) of the ILPLL is aligned and/or synchronized with a phase of an output signal of the VCO.

Some example embodiments of inventive concepts also provide semiconductor memory devices including ILPLLs in which a phase of an injection signal injected into a VCO of the ILPLL is aligned with a phase of an output signal of the VCO.

In accordance with at least one example embodiment of inventive concepts, an ILPLL circuit includes: a delay-locked loop (DLL) configured to generate a DLL clock by performing a delay-locked operation on a reference clock; and an ILPLL configured to generate an output clock by performing an injection synchronous phase-locked operation on the reference clock. The DLL clock is injected into a VCO as an injection clock of the VCO of the ILPLL.

In accordance with at least one example embodiment of inventive concepts, an ILPLL circuit includes: a delay-locked loop (DLL) configured to generate a DLL clock by performing a delay-locked operation on a reference clock; and an ILPLL including a VCO, the ILPLL being configured to generate an output clock by performing an injection synchronous phase-locked operation on the reference clock. The DLL clock is injected into the VCO as an injection clock of the VCO.

The DLL may include: a phase detector configured to generate a first phase detection signal by comparing phases of the reference clock and the DLL clock; a charge pump and a loop filter configured to generate a delay-controlled voltage in response to the first phase detection signal; and a voltage-controlled delay line configured to output the DLL clock by delaying the reference clock in response to the delay-controlled voltage.

The ILPLL may include: a phase frequency detector configured to generate a second phase detection signal by comparing phases of the reference clock and the output clock; and a charge pump and a loop filter configured to generate an oscillation-controlled voltage in response to the second phase detection signal generated in the phase frequency detector. The VCO may be configured to generate the output clock in response to the oscillation-controlled voltage and the injection clock.

A length of a wire between the VCO and the phase frequency detector may be the same or substantially the same as a length of a wire between the voltage-controlled delay line and the phase detector.

A length of a wire between an input terminal that receives the reference clock and the phase frequency detector may be the same or substantially the same as a length of a wire between the input terminal that receives the reference clock and the phase detector.

The ILPLL may further include an output clock delay between the VCO and the phase frequency detector. The DLL may further include an injection clock delay between the voltage-controlled delay line and the phase detector. Delays of the output clock delay and the injection clock delay may be the same or substantially the same.

The ILPLL may further include a first reference clock delay between an input terminal that receives the reference clock and the phase frequency detector. The DLL may further include a second reference clock delay between the input terminal that receives the reference clock and the phase detector. Delays of the first and second reference clock delays may be the same or substantially the same.

The output clock delay may be a divider including n D flip-flops having m logic circuit stages, and the injection clock delay may include m*n inverters connected in series.

In accordance with at least one other example embodiment of inventive concepts, a semiconductor memory device includes: a memory core including a plurality of memory cells; a control circuit configured to write data to, or read data from, the plurality of memory cells in response to command and address signals; and an internal clock generation circuit configured to generate an internal clock for operation of the semiconductor memory device.

The internal clock generation circuit includes: a DLL configured to generate a DLL clock by performing a delay-locked operation on a reference clock; and an ILPLL including a VCO, the ILPLL being configured to generate the internal clock by performing an injection synchronous phase-locked operation on the reference clock. The DLL clock is injected into the VCO as an injection clock of the VCO.

The semiconductor memory device may be a dynamic random access memory (DRAM).

In accordance with at least one other example embodiment, an injection-locked phase-locked loop (ILPLL) circuit includes: a delay-locked loop (DLL) configured to generate a DLL clock based on a reference clock; and a voltage controlled oscillator configured to generate an output clock based on the DLL clock and an oscillation controlled voltage, the oscillation controlled voltage being generated based on the reference clock and the output clock, and a phase of the output clock being aligned with a phase of the DLL clock.

According to at least some example embodiments, the DLL may include: a phase detector configured to generate a phase detection signal based on a comparison between phases of the reference clock and the DLL clock; a charge pump and loop filter circuit configured to generate a delay-controlled voltage based on the phase detection signal; and a voltage-controlled delay line configured to generate the DLL clock by delaying the reference clock based on the delay-controlled voltage.

The ILPLL may include: a phase frequency detector configured to generate a phase detection signal based on a comparison between phases of the reference clock and the output clock; and a charge pump and loop filter circuit configured to generate the oscillation-controlled voltage based on the phase detection signal.

According to at least some example embodiments, the DLL may include: a reference clock delay circuit configured to delay the reference clock to generate a delayed reference clock; an injection clock delay circuit configured to delay the DLL clock to generate a delayed DLL clock; a phase detector configured to generate a phase detection signal based on a comparison between phases of the delayed reference clock and the delayed DLL clock; a charge pump and loop filter circuit configured to generate a delay-controlled voltage based on the phase detection signal; and a voltage-controlled delay line configured to generate the DLL clock by delaying the reference clock based on the delay-controlled voltage.

The ILPLL may further include: a reference clock delay circuit configured to delay the reference clock to generate a delayed reference clock; an output clock delay circuit configured to delay the output clock to generate a delayed output clock; a phase frequency detector configured to generate a phase detection signal based on a comparison between phases of the delayed reference clock and the delayed output clock; and a charge pump and loop filter circuit configured to generate the oscillation-controlled voltage based on the phase detection signal.

In accordance with at least one other example embodiment of inventive concepts, a semiconductor memory device includes: a memory core including a plurality of memory cells; a control circuit configured to write data to, and read data stored in, the plurality of memory cells in response to command and address signals; and an internal clock generation circuit configured to generate an internal clock for operation of the semiconductor memory device. The internal clock generation circuit includes: a delay-locked loop (DLL) configured to generate a DLL clock based on a reference clock; and a voltage controlled oscillator configured to generate the internal clock based on the DLL clock and an oscillation controlled voltage, the oscillation controlled voltage being generated based on the reference clock and the internal clock, and a phase of the internal clock being aligned with a phase of the DLL clock.

According to at least some example embodiments, the DLL may include: a phase detector configured to generate a phase detection signal based on a comparison between phases of the reference clock and the DLL clock; a charge pump and loop filter circuit configured to generate a delay-controlled voltage based on the phase detection signal; and a voltage-controlled delay line configured to generate the DLL clock by delaying the reference clock based on the delay-controlled voltage.

The ILPLL may include: a phase frequency detector configured to generate a phase detection signal based on a comparison between phases of the reference clock and the internal clock; and a charge pump and loop filter circuit configured to generate the oscillation-controlled voltage based on the phase detection signal.

According to at least some example embodiments, the DLL may include: a reference clock delay circuit configured to delay the reference clock to generate a delayed reference clock; an injection clock delay circuit configured to delay the DLL clock to generate a delayed DLL clock; a phase detector configured to generate a phase detection signal based on a comparison between phases of the delayed reference clock and the delayed DLL clock; a charge pump and loop filter circuit configured to generate a delay-controlled voltage based on the phase detection signal; and a voltage-controlled delay line configured to generate the DLL clock by delaying the reference clock based on the delay-controlled voltage.

The ILPLL may further include: a reference clock delay circuit configured to delay the reference clock to generate a delayed reference clock; an output clock delay circuit configured to delay the internal clock to generate a delayed internal clock; a phase frequency detector configured to generate a phase detection signal based on a comparison between phases of the delayed reference clock and the delayed internal clock; and a charge pump and loop filter circuit configured to generate the oscillation-controlled voltage based on the phase detection signal.

BRIEF DESCRIPTION OF THE DRAWINGS

Inventive concepts will be apparent from the more particular description of example embodiments illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
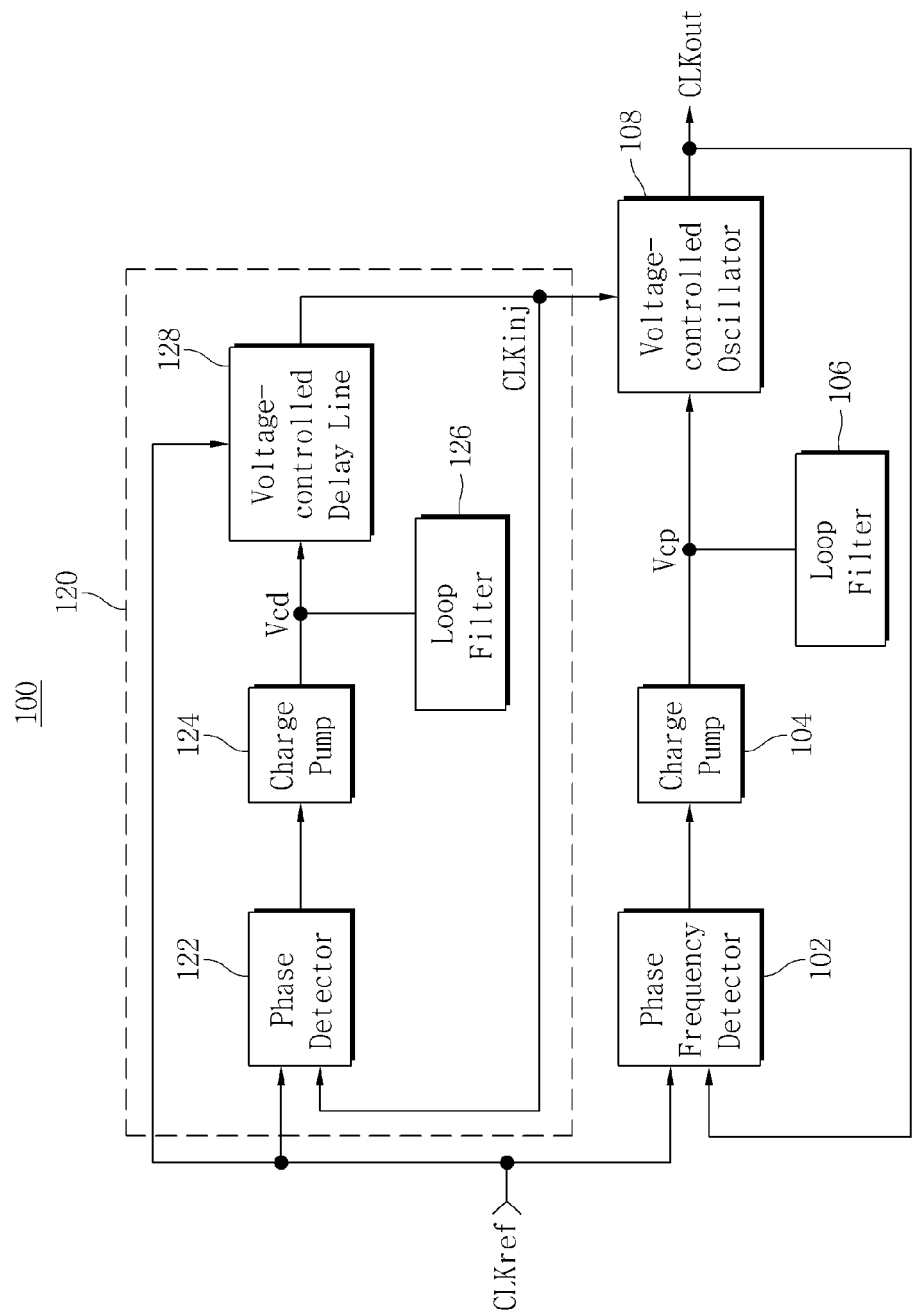
FIG. 1 is a circuit diagram showing an injection-locked phase-locked loop (ILPLL) circuit in accordance with an example embodiment of inventive concepts.

Example embodiments will now be described more fully with reference to the accompanying drawings. Many alternate forms may be embodied and example embodiments should not be construed as limited to example embodiments set forth herein. In the drawings, like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

While inventive concepts are susceptible to various modifications and alternative forms, specific example embodiments thereof are shown by way of example in the drawings and will herein be described in detail. It should be understood, however, that there is no intent to limit inventive concepts to the particular forms disclosed, but on the contrary, inventive concepts are to cover all modifications, equivalents, and alternatives falling within the spirit and scope of inventive concepts.

It will be understood that when an element is referred to as being "connected" or "coupled" to another element, it can be directly connected or coupled to the other element or intervening elements may be present. In contrast, when an element is deterred to as being "directly connected" or "directly coupled" to another element, there are no intervening elements present. Other words used to describe the relationship between elements should be interpreted in a like fashion, that is, "between" versus "directly between," "adjacent" versus "directly adjacent," etc.

The terminology used herein is for the purpose of describing particular embodiments only and is not intended to be limiting of inventive concepts. As used herein, the singular forms "a," "an" and "the" are intended to include the plural forms as well, unless the context clearly indicates otherwise. It will be further understood that the terms "comprises" "comprising" "includes" and/or "including," when used in this specification, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, illustrative embodiments may be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems. Such existing hardware may include one or more Central Processing Units (CPUs), digital signal processors (DSPs), application-specific-integrated-circuits (ASICs), field programmable gate arrays (FPGAs), system-on-chips (SoCs), computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements.

As discussed herein, example embodiments of injection-locked phase-locked loops (or injection-locked phase-locked loop circuits) and/or one or more components thereof may be hardware, firmware, hardware executing software or any combination thereof. When the injection-locked phase-locked loops (or loop circuits) and/or one or more components thereof are hardware, such hardware may include one or more Central Processing circuits (CPUs), system-on-chips (SOCs), digital signal processors (DSPs), application-specific-integrated-circuits (ASICs), field programmable gate arrays (FPGAs) computers or the like configured as special purpose machines to perform the functions of the injection-locked phase-locked loops (or loop circuits). CPUs, SOCs, DSPs, ASICs and FPGAs may sometimes generally be referred to as processors and/or microprocessors.

Hereinafter, example embodiments of inventive concepts will be described in detail with reference to the accompanying drawings.

FIG. 1 is a circuit diagram showing an injection-locked phase-locked loop (ILPLL) circuit in accordance with an example embodiment of inventive concepts.

Referring to FIG. 1, an ILPLL circuit 100 may include: a phase frequency detector 102 configured to receive a reference clock CLKref and a output clock CLKout; a charge pump 104; a loop filter 106; a voltage-controlled oscillator (VCO) 108; and a delay-locked loop (DLL) 120 configured to receive the reference clock CLKref and output an injection clock CLKinj. The charge pump 104 and the loop filter 106 may sometimes be referred to herein as a charge pump and loop filter circuit.

The phase frequency detector 102 may receive the reference clock CLKref and the output clock CLKout output from the VCO 108, and generate and output a phase detection signal (e.g., an up detection signal or a down detection signal) by comparing phases of the reference clock CLKref and the output clock CLKout.

When the phase of the output clock CLKout is later than the phase of the reference clock CLKref, the phase frequency detector 102 may generate and output an up detection signal corresponding to a phase difference thereof.

When the phase of the output clock CLKout is earlier than the phase of the reference clock CLKref, the phase frequency detector 102 may generate and output a down detection signal corresponding to a phase difference thereof.

The charge pump 104 may supply electric charge to the loop filter 106 by performing a positive electric charge pumping operation in response to the up detection signal output from the phase frequency detector 102, and discharge the electric charge charged in the loop filter 106 by performing a negative electric charge pumping operation in response to the down detection signal output from the phase frequency detector 102.

The loop filter 106 may generate an oscillation-controlled voltage Vcp corresponding to the electric charge charged or discharged by the charge pump 104, and output the generated oscillation-controlled voltage Vcp to the VCO 108.

When the electric charge is charged in the loop filter 106 by the charge pump 104, the oscillation-controlled voltage Vcp increases, whereas when the electric charge is discharged from the loop filter 106 by the charge pump 104, the oscillation-controlled voltage Vcp decreases.

The charge pump 104 and the loop filter 106 generate the oscillation-controlled voltage Vcp corresponding to the phase detection signal output from the phase frequency detector 102, and output the oscillation-controlled voltage Vcp to the VCO 108.

The VCO 108 may generate and output the output clock CLKout having a constant or substantially constant frequency in response to the injection clock CLKinj received from the DLL 120 and the oscillation-controlled voltage Vcp received from the loop filter 106.

The DLL 120 may receive the reference clock CLKref, generate a DLL clock by performing a delay-locked operation on the reference clock CLKref, and output the generated DLL clock as the injection clock CLKinj, which is an injection signal of the ILPLL to the VCO 108. The DLL 120 may include: a phase detector 122; a charge pump 124; a loop filter 126; and a voltage-controlled delay line (VCDL) 128. The charge pump 124 and the loop filter 126 may sometimes be referred to herein as a charge pump and loop filter circuit.

The phase detector 122 may receive the reference clock CLKref and the injection clock CLKinj output from the voltage-controlled delay line 128, and generate and output the phase detection signal (e.g., an up detection signal or a down detection signal) by comparing phases of the reference clock CLKref and the injection clock CLKinj.

When the phase of the injection clock CLKinj is later than the phase of the reference clock CLKref, the phase detector 122 may generate and output the up detection signal corresponding to a phase difference thereof.

When the phase of the injection clock CLKinj is earlier than the phase of the reference clock CLKref, the phase detector 122 may generate and output the down detection signal corresponding to a phase difference thereof.

The charge pump 124 may supply electric charge to the loop filter 126 by performing a positive electric charge pumping operation in response to the up detection signal output from the phase detector 122, and discharge the electric charge charged in the loop filter 126 by performing a negative electric charge pumping operation in response to the down detection signal output from the phase detector 122.

The loop filter 126 may generate a delay-controlled voltage Vcd corresponding to the electric charge charged or discharged by the charge pump 124, and output the delay-controlled voltage Vcd to the voltage-controlled delay line 128.

When the electric charge is charged in the loop filter 126 by the charge pump 124, the delay-controlled voltage Vcd increases, whereas when the electric charge is discharged from the loop filter 126 by the charge pump 124, the delay-controlled voltage Vcd decreases.

The charge pump 124 and the loop filter 126 generate the delay-controlled voltage Vcd corresponding to the phase detection signal output from the phase detector 122, and output the delay-controlled voltage Vcd to the voltage-controlled delay line 128.

The voltage-controlled delay line 128 may receive the reference clock CLKref, and generate and output the injection clock CLKinj in which the phase of the reference clock CLKref is delayed in response to the delay-controlled voltage Vcd received from the loop filter 126.

According to at least some example embodiments, the width and/or length of a wire between an input terminal that receives the reference clock CLKref and the phase frequency detector 102 may be the same or substantially the same as that of a wire between the input terminal that receives the reference clock CLKref and the phase detector 122.

In at least one other example embodiment, the width and/or length of a wire between the VCO 108 and the phase frequency detector 102 may be the same or substantially the same as that of a wire between the voltage-controlled delay line 128 and the phase detector 122.

Figure 2:
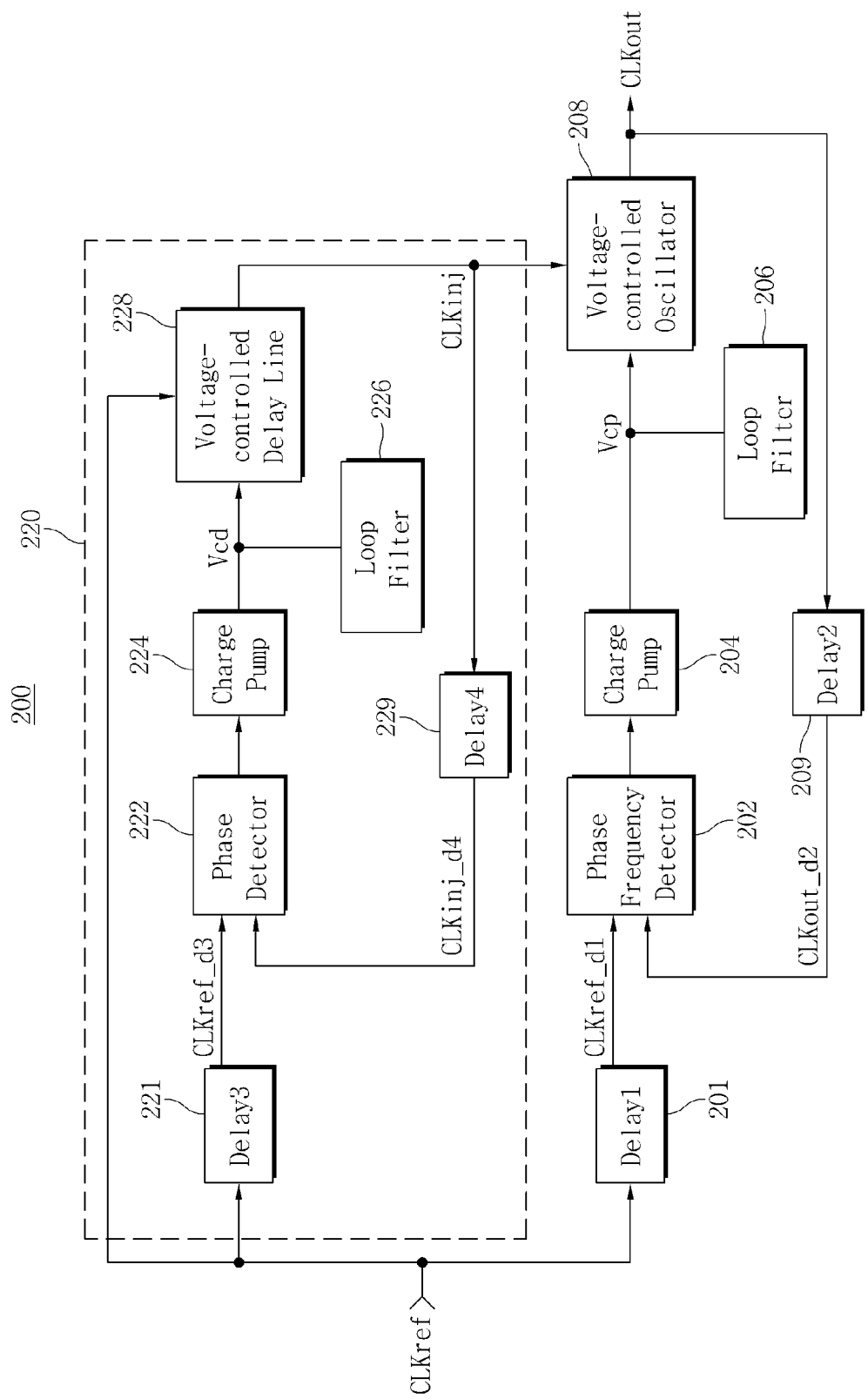
FIG. 2 is a circuit diagram showing an ILPLL circuit in accordance with another example embodiment of inventive concepts.

FIG. 2 is a circuit diagram showing an ILPLL circuit in accordance with another example embodiment of inventive concepts.

Referring to FIG. 2, an ILPLL 200 may include: a first delay (first reference clock delay) 201 that delays a reference clock CLKref by a first delay d1; a phase frequency detector 202 configured to receive a first-delayed reference clock CLKref_d1 and a second-delayed output clock CLKout_d2; a charge pump 204; a loop filter 206; a VCO 208; a second delay (output clock delay) 209; and a DLL 220 configured to receive the reference clock CLKref and output an injection clock CLKinj.

The first delay 201 may output the first-delayed reference clock CLKref_d1 in which the received reference clock CLKref is delayed by the first delay d1. In one example, the first delay 201 may be a delay buffer.

The phase frequency detector 202 may receive the first-delayed reference clock CLKref_d1 and the second-delayed output clock CLKout_d2, and generate and output a phase detection signal (e.g., an up detection signal or a down detection signal) by comparing phases of the first-delayed reference clock CLKref_d1 and the second-delayed output clock CLKout_d2.

When the phase of the second-delayed output clock CLKout_d2 is later than the phase of the first-delayed reference clock CLKref_d1, the phase frequency detector 202 may generate and output an up detection signal corresponding to a phase difference thereof.

When the phase of the second-delayed output clock CLKout_d2 is earlier than the phase of the first-delayed reference clock CLKref_d1, the phase frequency detector 202 may generate and output a down detection signal corresponding to a phase difference thereof.

The charge pump 204 may supply electric charge to the loop filter 206 by performing a positive electric charge pumping operation in response to the up detection signal output from the phase frequency detector 202, and discharge the electric charge charged in the loop filter 206 by performing a negative electric charge pumping operation in response to the down detection signal output from the phase frequency detector 202.

The loop filter 206 may generate an oscillation-controlled voltage Vcp corresponding to the electric charge charged or discharged by the charge pump 204, and output the oscillation-controlled voltage Vcp to the VCO 208.

If the electric charge is charged in the loop filter 206 by the charge pump 204, the oscillation-controlled voltage Vcp increases, whereas if the electric charge is discharged from the loop filter 206 by the charge pump 204, the oscillation-controlled voltage Vcp decreases.

The charge pump 204 and the loop filter 206 generate the oscillation-controlled voltage Vcp corresponding to the phase detection signal output from the phase frequency detector 202, and output the oscillation-controlled voltage Vcp to the VCO 208.

The VCO 208 may generate and output an output clock CLKout having a constant or substantially constant frequency in response to the injection clock CLKinj received from the DLL 220 and the oscillation-controlled voltage Vcp received from the loop filter 206.

The second delay (output clock delay) 209 may output the second-delayed output clock CLKout_d2 in which the received output clock CLKout is delayed by a second delay d2. The second delay 209 may be a delay buffer or a divider.

The DLL 220 may receive the reference clock CLKref, generate a DLL clock by performing a delay-locked operation on the reference clock CLKref, and output the generated DLL clock as the injection clock CLKinj, which is an injection signal of the ILPLL to the VCO 208.

The DLL 220 may include: a third delay (second reference clock delay) 221; a phase detector 222; a charge pump 224; a loop filter 226; a voltage-controlled delay line (VCDL) 228; and a fourth delay (injection clock delay) 229. The charge pump 224 and the loop filter 226 may be referred to herein as a charge pump and loop filter circuit.

The third delay 221 may output a third-delayed reference clock CLKref_d3 in which the received reference clock CLKref is delayed by a third delay d3. The third delay 221 may be a delay buffer having the same or substantially the same delay value as the first delay 201.

For example, when the first delay 201 is configured to connect m buffers in series, the third delay 221 may be configured to connect m buffers in series like the first delay 201.

The phase detector 222 may receive the third-delayed reference clock CLKref_d3 and a fourth-delayed injection clock CLKinj_d4, and generate and output a phase detection signal (e.g., an up detection signal or a down detection signal) by comparing phases of the third-delayed reference clock CLKref_d3 and the fourth-delayed injection clock CLKinj_d4.

When the phase of the fourth-delayed injection clock CLKinj_d4 is later than the phase of the third-delayed reference clock CLKref_d3, the phase detector 222 may generate and output an up detection signal corresponding to a phase difference thereof.

When the phase of the fourth-delayed injection clock CLKinj_d4 is earlier than the phase of the third-delayed reference clock CLKref_d3, the phase detector 222 may generate and output a down detection signal corresponding to a phase difference thereof.

The charge pump 224 may supply electric charge to the loop filter 226 by performing a positive electric charge pumping operation in response to the up detection signal output from the phase detector 222, and discharge the electric charge charged in the loop filter 226 by performing a negative electric charge pumping operation in response to the down detection signal output from the phase detector 222.

The loop filter 226 may generate a delay-controlled voltage Vcd corresponding to the electric charge charged or discharged by the charge pump 224, and output the delay-controlled voltage Vcd to the voltage-controlled delay line 228.

When the electric charge is charged in the loop filter 226 by the charge pump 224, the delay-controlled voltage Vcd increases, whereas when the electric charge is discharged from the loop filter 226 by the charge pump 224, the delay-controlled voltage Vcd decreases.

The charge pump 224 and the loop filter 226 generate the delay-controlled voltage Vcd corresponding to the phase detection signal output from the phase detector 222, and output the delay-controlled voltage Vcd to the voltage-controlled delay line 228.

The voltage-controlled delay line 228 may receive the reference clock CLKref, and generate and output the injection clock CLKinj in which a phase of the reference clock CLKref is delayed in response to the delay-controlled voltage Vcd received from the loop filter 226.

The fourth delay 229 may output the fourth-delayed injection clock CLKinj_d4 in which the received injection clock CLKinj is delayed by a fourth delay d4. The fourth delay 229 may be a delay buffer having the same or substantially the same delay value as the second delay 209.

For example, when the second delay 209 is a divider of which m flip-flops are connected in series, the fourth delay 229 may be a delay of which m buffers are connected in series.

In at least one other example embodiment, the first delay 201 and the third delay 221 may be omitted in FIG. 2.

Figure 3:
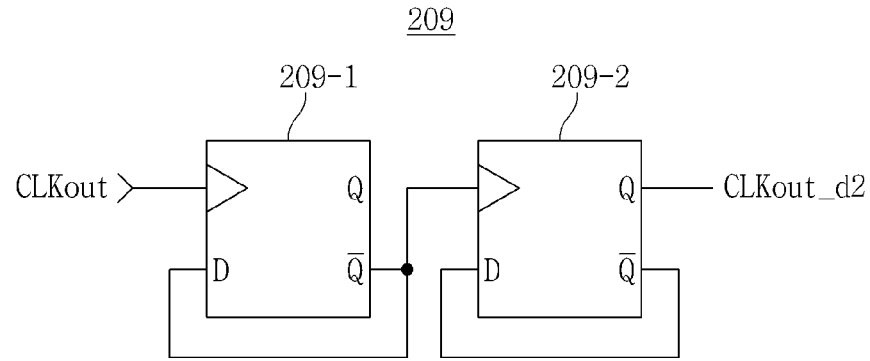
FIG. 3 is a circuit diagram showing an example in which a second delay (output clock delay) of the ILPLL circuit is a quarter divider in accordance with an example embodiment of inventive concepts.

FIG. 3 is a circuit diagram showing an example in which a second delay (output clock delay) of an ILPLL is a quarter divider in accordance with an example embodiment of inventive concepts.

Referring to FIG. 3, the second delay 209 includes two D flip-flops connected in series.

At a Q output terminal of a first flip-flop 209-1, a clock having a half frequency of an output clock CLKout and delayed by a given (or alternatively desired or predetermined) delay value from the output clock CLKout may be output.

At a Q output terminal of a second flip-flop 209-2, a second-delayed output clock CLKout_d2 having a quarter frequency of the frequency of the output clock CLKout and delayed by a second delay d2 from the output clock CLKout may be output.

Since the first flip-flop 209-1 and the second flip-flop 209-2 are configured of flip-flops having the same logical gate structure, the second delay d2 may have a delay value two times the delay value of the first or second flip-flop.

Figure 4A:
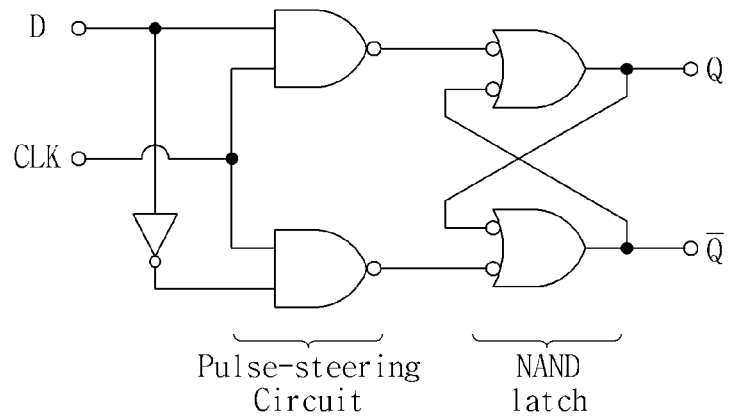
FIG. 4A is a logic circuit diagram of the first flip-flop and the second flip-flop included in the second delay shown in FIG. 3.

FIG. 4A is a logic circuit diagram of the first flip-flop and the second flip-flop included in the second delay 209 shown in FIG. 3. Each of the first flip-flop and the second flip-flop may be configured as a two-stage logic circuit causing a delay of a clock. That is, for example, each flip-flop may be configured as a two-stage logic circuit configured as a pulse-steering circuit and a NAND latch.

Figure 4B:
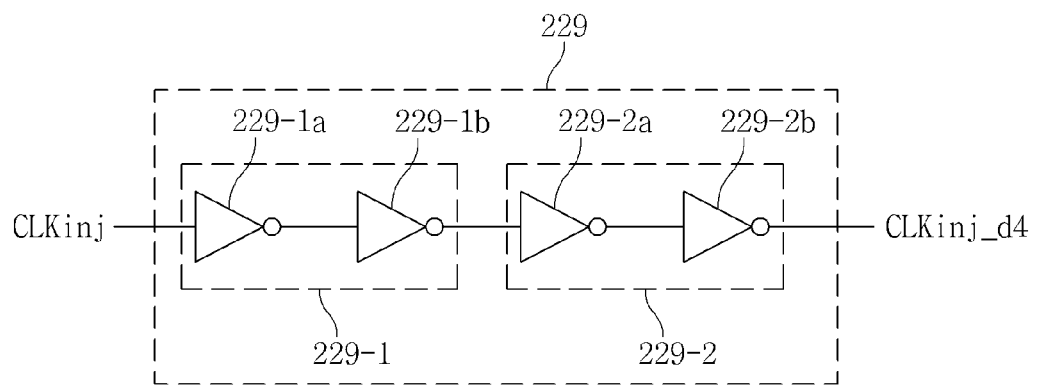
FIG. 4B is a circuit diagram of a fourth delay (injection clock delay) corresponding to the second delay shown in FIG. 3.

FIG. 4B is a circuit diagram of a fourth delay (injection clock delay) corresponding to the second delay shown in FIG. 3.

Referring to FIG. 4B, a fourth delay 229 may be configured as a first delay buffer 229-1 and a second delay buffer 229-2. The first delay buffer 229-1 may correspond to the first flip-flop 209-1, and the second delay buffer 229-2 may correspond to the second flip-flop 209-2.

The first delay buffer 229-1 may be configured as two inverters 229-1a and 229-1b. The inverter 229-1a may correspond to the pulse-steering circuit of the first flip-flop 209-1, and the inverter 229-1b may correspond to the NAND latch of the first flip-flop 209-1.

The second delay buffer 229-2 may be configured as two inverters 229-2a and 229-2b. The inverter 229-2a may correspond to the pulse-steering circuit of the second flip-flop 209-2, and the inverter 229-2b may correspond to the NAND latch of the second flip-flop 209-2.

Each of the inverters may have the same or substantially the same delay value as a corresponding logic circuit stage.

Each of the inverters may have the same or substantially the same delay value.

In at least one example embodiment of inventive concepts, when the second delay is configured to connect n flip-flops having m-stage logic circuits in series, the fourth delay may be set to have the same or substantially the same delay value as the second delay since the fourth delay is configured to connect m*n inverters in series.

Figure 5:
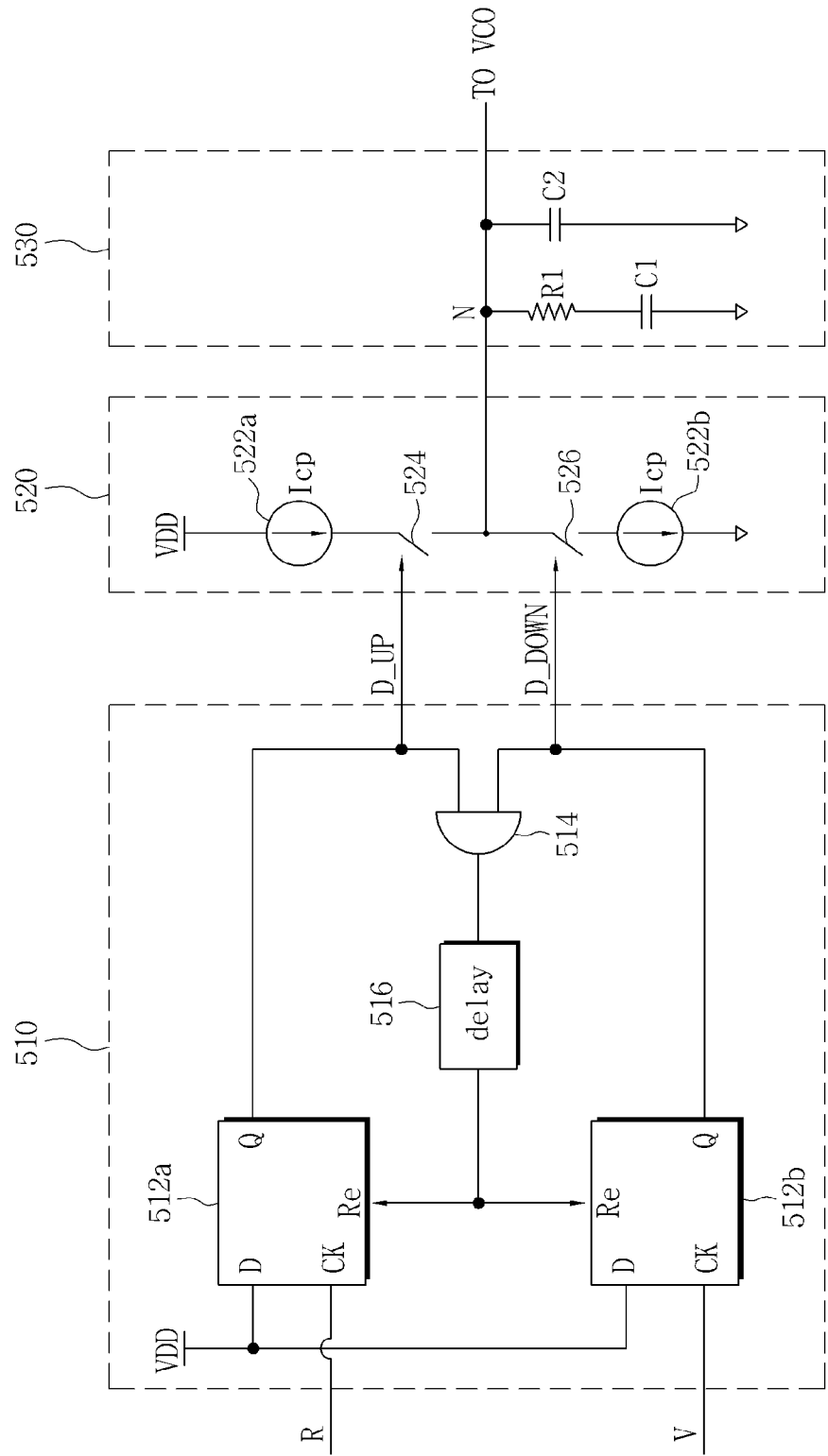
FIG. 5 is a circuit diagram for describing an example of a phase frequency detector, a charge pump, and a loop filter of an ILPLL circuit in accordance with an example embodiment of inventive concepts.

FIG. 5 is a circuit diagram for describing an example of a phase frequency detector, a charge pump, and a loop filter of an ILPLL in accordance with an example embodiment of inventive concepts.

Referring to FIG. 5, a phase frequency detector 510 may include: a first D flip-flop 512a; a second D flip-flop 512b; an AND gate 514; and a delay 516.

A reference clock CLKref or a first-delayed reference clock CLKref_d1 may be input to a clock input terminal CK of the first D flip-flop 512a, and an output clock CLKout or a second-delayed output clock CLKout_d2 may be input to a clock input terminal CK of the second D flip-flop 512b.

Data input terminals D of the D flip-flops may be connected to a power source VDD, and may receive a logic high level.

Each data output terminal Q of the D flip-flops may output an up detection signal D_UP and a down detection signal D_DOWN. The up detection signal D_UP may indicate a clock input to a reference terminal R whose phase is advanced to that of a clock input to a feedback terminal V. The down detection signal D_DOWN may indicate a clock input to a reference terminal R whose phase is later than that of a clock input to a feedback terminal V.

The AND gate 514 may receive the up detection signal D_UP and the down detection signal D_DOWN and perform a logic AND operation with respect to the two signals.

The delay 516 may delay an output of the AND gate 514 by a given (or alternatively desired or predetermined) time td, and provide a reset signal to reset input terminals Re of the D flip-flops.

The charge pump 520 may have a configuration in which charge pump current sources 522a and 522b, and switches 524 and 526 are connected in series between the power source VDD and a circuit ground.

The charge pump current sources 522a and 522b may supply charge pump current Icp.

The switch 524 may receive the up detection signal, be turned on by a logic high level of the up detection signal, and connect the charge pump current source 522a to an output node N of the charge pump 520.

The switch 526 may receive the down detection signal, be turned on by a logic high level of the down detection signal, and connect the charge pump current source 522b to an output node N of the charge pump 520.

The td delay by the delay 516 may be used to process a dead zone of the charge pump 520. The charge pump current sources 522a and 522b may require a certain amount of time to be turned on and off. This transitional time is referred to the dead zone because phase information of the up detection signal and the down detection signal are lost during the transitional time.

A loop filter 530 may include a first capacitor C1 and a resistor R1, which are connected in series between the output node N and the circuit ground, and a second capacitor C2 connected between the output node N and the circuit ground.

The first capacitor C1 may generate an oscillation-controlled voltage to the output node N by charging/discharging electric charge output from the charge pump 520. The oscillation-controlled voltage may be provided to a voltage-controlled oscillator (VCO). The resistor R1 may suppress an abrupt change in current flowing through the first capacitor C1.

The second capacitor C2 may absorb impulse current when the ILPLL is locked, and capacitance thereof may be smaller or substantially smaller than that of the first capacitor C1.

Figure 6:
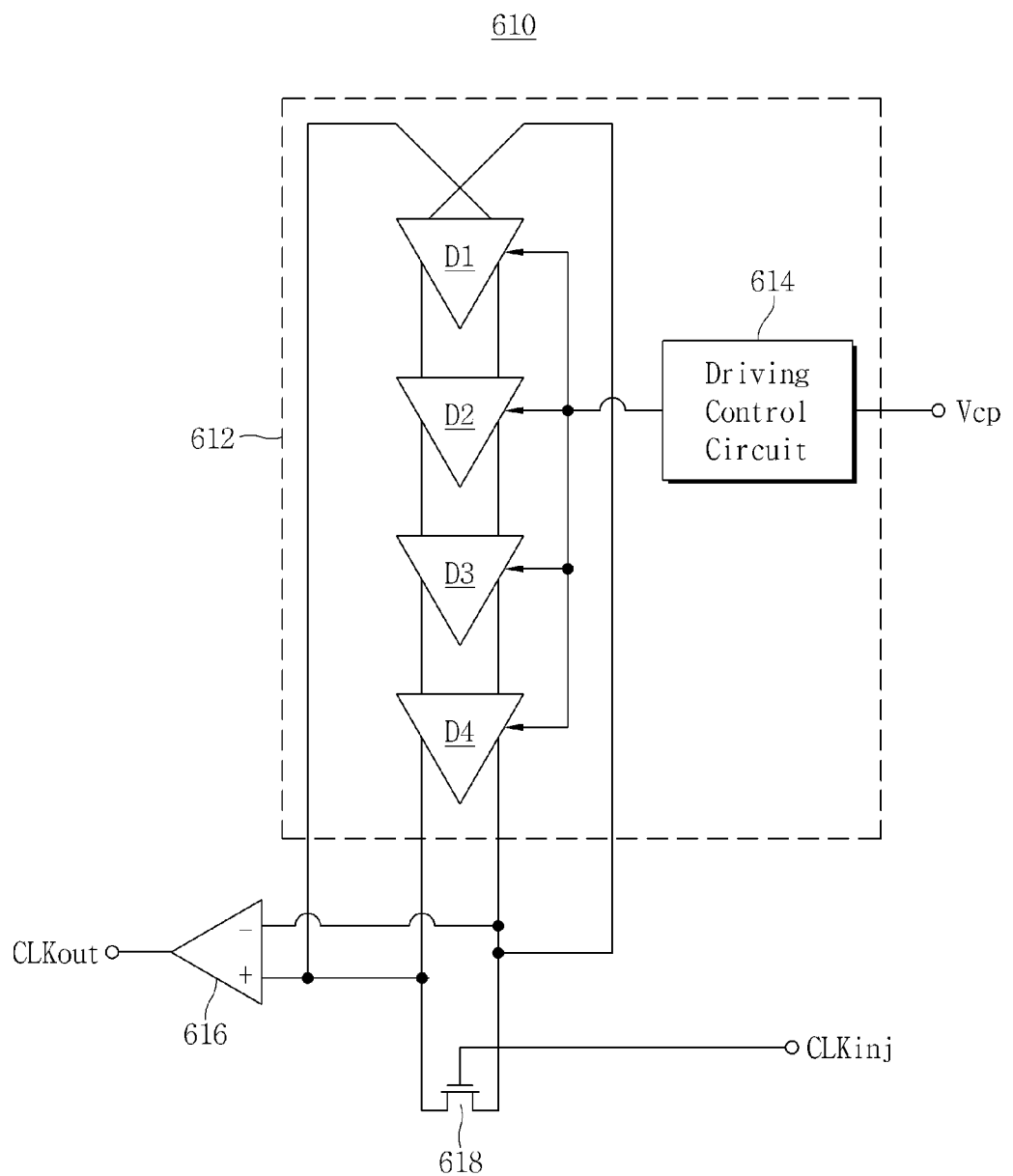
FIG. 6 is a circuit diagram for describing an example of a voltage-controlled oscillator (VCO) of an ILPLL circuit in accordance with an example embodiment of inventive concepts.

FIG. 6 is a circuit diagram for describing an example of a VCO of an ILPLL in accordance with an example embodiment of inventive concepts.

Referring to FIG. 6, a VCO 610 may include: a differential ring oscillator 612; an operational amplifier (OP-amp) 616; and an injection switch 618.

The differential ring oscillator 612 may include a driving control circuit 614, and cascaded differential delay cells D1 to D4.

As the driving control circuit 614 applies power to the cascaded differential delay cells D1 to D4 according to an oscillation-controlled voltage Vcp, an oscillation by the cascaded differential delay cells D1 to D4 may be adjusted.

The OP-amp 616 may receive a differential output of the differential delay cell D4 and output an output clock CLKout.

The injection switch 618 may be connected between outputs of the differential delay cell D4, and may perform an injection-locked technique and/or operation by being turned on by an injection clock CLKinj.

In at least one other example embodiment, the differential ring oscillator 612 may be replaced by other oscillators.

Figure 7:
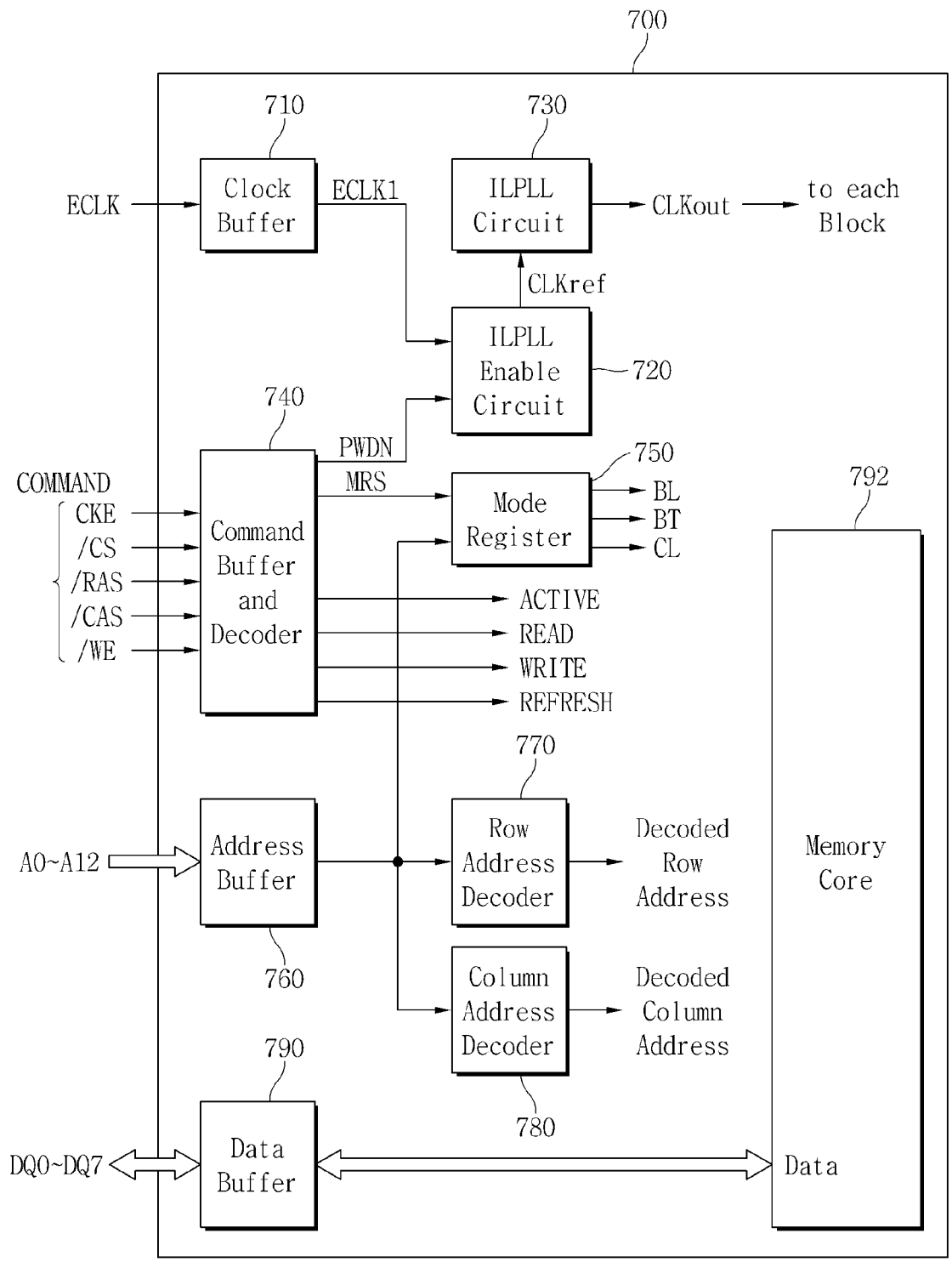
FIG. 7 is a block diagram of a semiconductor memory device including an ILPLL circuit in accordance with an example embodiment of inventive concepts.

FIG. 7 is a block diagram of a semiconductor memory device including an ILPLL in accordance with an example embodiment of inventive concepts.

Referring to FIG. 7, a semiconductor memory device 700 may include: a clock buffer 710; an ILPLL enable circuit 720; an ILPLL circuit 730; a command buffer and decoder 740; a mode register 750; an address buffer 760; a row address decoder 770; a column address decoder 780; a data buffer 790; and a memory core 792. The semiconductor memory device 700 may be a dynamic random access memory (DRAM), or the like.

The clock buffer 710 may receive an external clock ECLK, and output a buffered external clock ECLK1.

The ILPLL enable circuit 720 may receive the buffered external clock ECLK1, and output a reference clock CLKref to the ILPLL circuit 730 in response to a power down signal PWDN.

The ILPLL circuit 730 may generate an output clock CLKout to drive the semiconductor memory device 700. The output clock CLKout may be applied to each block of the semiconductor memory device 700 to be used as an internal clock for driving the semiconductor memory device 700, and synchronized with the reference clock CLKref. The ILPLL circuit 730 may be an ILPLL circuit according to at least some example embodiments (e.g., as shown in FIG. 1 or FIG. 2).

The command buffer and decoder 740 may receive a command from the outside, decode the received command, and output the power down signal PWDN, a mode register set (MRS) signal, an active signal ACTIVE, a read signal READ, a write signal WRITE, and a refresh signal REFRESH.

The mode register 750 may output a burst length signal BL, a burst type signal BT, and a column address strobe (CAS) latency signal CL, which are signals to adjust an operational mode of the DRAM in response to the mode register set (MRS) signal and the buffered address signal.

The address buffer 760 may receive address signals A0 to A12 from the outside, and output the buffered address signal to the mode register 750, the row address decoder 770, and the column address decoder 780.

The row address decoder 770 may output the decoded row address signal after decoding the buffered address signal.

The column address decoder 780 may output the decoded column address signal after decoding the buffered address signal.

The data buffer 790 may output the buffered data to the memory core 792 or the outside after buffering data received from the outside or data received from the memory core 792.

The memory core 792 may include a plurality of memory cells, and write data received from the data buffer 790 to the memory cells or output the data to the data buffer 790 by reading data stored in the memory cells.

Figure 8:
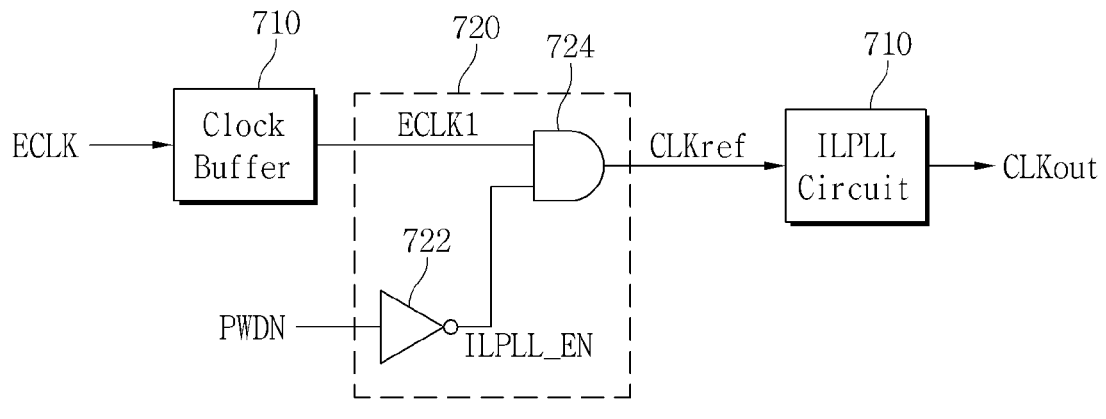
FIG. 8 is a diagram showing an example configuration of the ILPLL enable circuit shown in FIG. 7.

FIG. 8 is a diagram showing an example configuration of the ILPLL enable circuit shown in FIG. 7.

Referring to FIG. 8, an ILPLL enable circuit 720 may include: an inverter 722 configured to output after receiving and inverting the power down signal PWDN; and an AND gate 724, which outputs a reference clock CLKref resulting from a logical product of the buffered external clock ECLK1 received from the clock buffer 710 and the inverted power down signal to the ILPLL circuit 730.

When the power down signal PWDN is at a logic high level H, an output of the output clock CLKout of the ILPLL circuit 730 may be off, whereas when the power down signal PWDN is at a logic low level L, an output of the output clock CLKout of the ILPLL circuit 730 may be on.

Figure 9:
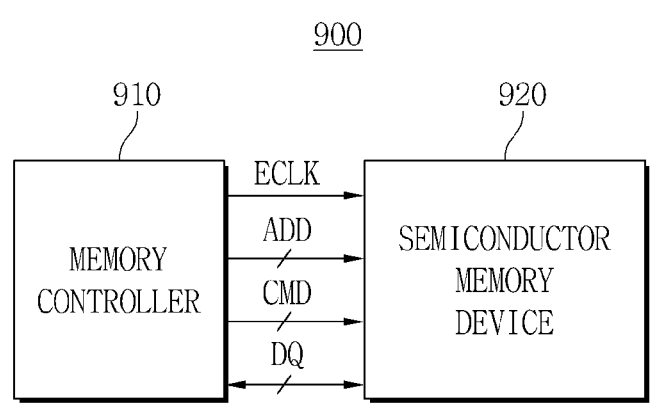
FIG. 9 is a block diagram showing an example of a memory system including a semiconductor memory device in accordance with example embodiments of inventive concepts.

FIG. 9 is a block diagram showing an example of a memory system including a semiconductor memory device in accordance with an example embodiment of inventive concepts.

Referring to FIG. 9, a memory system 900 may include a memory controller 910 and a semiconductor memory device 920.

The memory controller 910 may generate an external clock ECLK, an address signal ADD, and a command CMD, and transmit the external clock ECLK, the address signal ADD, and the command CMD to the semiconductor memory device 920 through a bus. Data DQ may be transmitted from the memory controller 910 to the semiconductor memory device 920 through the bus, or may be transmitted from the semiconductor memory device 920 to the memory controller 910 through the bus.

The semiconductor memory device 920 may include the semiconductor memory device 700 shown in FIG. 7, and an ILPLL circuit according to one or more example embodiments (e.g., as shown in FIG. 1 or FIG. 2).

Figure 10:
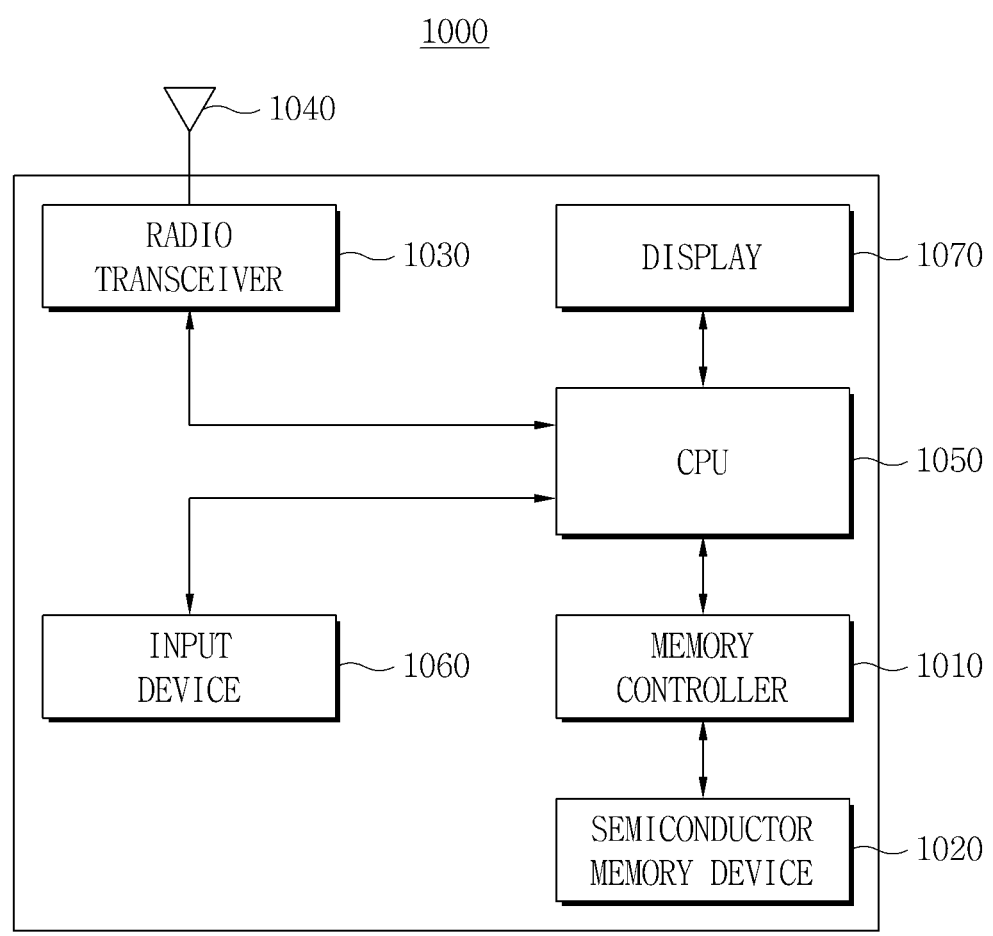
FIG. 10 is a diagram showing a computer system including a semiconductor memory device in accordance with an example embodiment of inventive concepts.

FIG. 10 is a diagram showing an example embodiment of a computer system including a semiconductor memory device in accordance with an example embodiment of inventive concepts.

Referring to FIG. 10, a computer system 1000 may include: a semiconductor memory device 1020; a memory controller 1010 configured to control the semiconductor memory device 1020; a radio transceiver 1030; an antenna 1040; a central processing unit (CPU) 1050; an input device 1060; and a display 1070.

The radio transceiver 1030 may transmit and receive a radio signal through the antenna 1040. For example, the radio transceiver 1030 may change a radio signal received through the antenna 1040 to a signal which may be processed in the CPU 1050.

The CPU 1050 may process the signal output from the radio transceiver 1030, and transmit the processed signal to the display 1070. The radio transceiver 1030 may change a signal output from the CPU 1050 to a radio signal, and transmit the changed radio signal to the outside through the antenna 1040.

The input device 1060 is a device capable of inputting a control signal for controlling an operation of the CPU 1050 and data, which is processed by the CPU 1050, and thus the input device 1060 may be implemented by a pointing device such as a touch pad and a computer mouse, a keypad, a keyboard, etc.

The memory controller 1010 may transmit data received from the CPU 1050 to the semiconductor memory device 1020, or transmit data received from the semiconductor memory device 1020 to the CPU 1050.

The semiconductor memory device 1020 may store data received from the memory controller 1010 in the memory cells, and transmit data read from the memory cells to the memory controller 1010. The semiconductor memory device 1020 may include the semiconductor memory device 700 shown in FIG. 7, and an ILPLL circuit according to one or more example embodiments (e.g., as shown in FIG. 1 or FIG. 2).

Example embodiments of inventive concepts may be used for ILPLL circuits and/or devices. For example, example embodiments may be usefully used for semiconductor memory devices including ILPLL circuits for generating an internal clock synchronized with an external clock.

According to at least some example embodiments of inventive concepts, as a phase of an injection signal injected into a VCO of an ILPLL is aligned with a phase of an output signal of a VCO, the output signal of the VCO may be set to have a more stable frequency.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An injection-locked phase-locked loop (ILPLL) circuit, comprising:
    a delay-locked loop (DLL) including a phase detector, the phase detector being configured to generate a first phase detection signal based on phases of a reference clock and a DLL clock, and the DLL being configured to generate the DLL clock based on the first phase detection signal; and
    an ILPLL including a voltage controlled oscillator (VCO), the ILPLL being configured to generate an output clock by performing an injection synchronous phase-locked operation on the reference clock, wherein
        the DLL clock is injected into the VCO as an injection clock of the VCO.

2. The ILPLL circuit of claim 1, wherein
    the phase detector is further configured to generate the first phase detection signal by comparing the phases of the reference clock and the DLL clock; and
    the DLL further includes
        a first charge pump and a first loop filter configured to generate a delay-controlled voltage in response to the first phase detection signal, and
        a voltage-controlled delay line configured to output the DLL clock by delaying the reference clock in response to the delay-controlled voltage.

3. The ILPLL circuit of claim 2, wherein the ILPLL comprises:
    a phase frequency detector configured to generate a second phase detection signal by comparing phases of the reference clock and the output clock;
    a second charge pump and a second loop filter configured to generate an oscillation-controlled voltage in response to the second phase detection signal; and wherein
    the VCO is configured to output the output clock in response to the oscillation-controlled voltage and the injection clock.

4. The ILPLL circuit of claim 3, wherein a length of a wire between the VCO and the phase frequency detector is the same as a length of a wire between the voltage-controlled delay line and the phase detector.

5. The ILPLL circuit of claim 3, wherein a length of a wire between an input terminal that receives the reference clock and the phase frequency detector is the same as a length of a wire between the input terminal that receives the reference clock and the phase detector.

6. The ILPLL circuit of claim 3, further comprising:
    an output clock delay circuit between the VCO and the phase frequency detector; and
    an injection clock delay circuit between the voltage-controlled delay line and the phase detector; wherein
        delays of the output clock delay circuit and the injection clock delay circuit are the same.

7. The ILPLL circuit of claim 6, wherein the output clock delay circuit is a divider including n flip-flops having m logic circuit stages, and the injection clock delay circuit includes m*n inverters connected in series.

8. The ILPLL circuit of claim 3, further comprising:
    a first reference clock delay circuit between an input terminal that receives the reference clock and the phase frequency detector; and
    a second reference clock delay circuit between the input terminal that receives the reference clock and the phase detector; wherein
        delays of the first reference clock delay circuit and the second reference clock delay circuit are the same.

9. A semiconductor memory device, comprising:
    a memory core including a plurality of memory cells;
    a control circuit configured to write data to, and read data stored in, the plurality of memory cells in response to command and address signals; and
    an internal clock generation circuit configured to generate an internal clock for operation of the semiconductor memory device, the internal clock generation circuit including,
        a delay-locked loop (DLL) including a phase detector, the phase detector being configured to generate a first phase detection signal based on phases of a reference clock and a DLL clock, and the DLL being configured to generate the DLL clock based on the first phase detection signal, and
        an injection-locked phase-locked loop (ILPLL) including a voltage-controlled oscillator (VCO), the ILPLL being configured to generate the internal clock by performing an injection synchronous phase-locked operation on the reference clock, and the DLL clock being injected into the VCO as an injection clock of the VCO.

10. The device of claim 9, wherein
    the phase detector is configured to generate the first phase detection signal by comparing phases of the reference clock and the DLL clock; and
    the DLL further includes
        a first charge pump and a first loop filter configured to generate a delay-controlled voltage in response to the first phase detection signal, and
        a voltage-controlled delay line configured to output the DLL clock by delaying the reference clock in response to the delay-controlled voltage.

11. The device of claim 10, wherein the ILPLL comprises:
a phase frequency detector configured to generate a second phase detection signal by comparing phases of the reference clock and the internal clock;
a second charge pump and a second loop filter configured to generate an oscillation-controlled voltage in response to the second phase detection signal; and wherein
the VCO is configured to output the internal clock in response to the oscillation-controlled voltage and the injection clock.

12. The device of claim 11, wherein a length of a wire between the VCO and the phase frequency detector is the same as a length of a wire between the voltage-controlled delay line and the phase detector.

13. The device of claim 11, further comprising:
an output clock delay circuit between the VCO and the phase frequency detector; and
an injection clock delay circuit between the voltage-controlled delay line and the phase detector, delays of the output clock delay circuit and the injection clock delay circuit being the same.

14. The device of claim 13, wherein the output clock delay circuit is a divider including n flip-flops having m logic circuit stages, and the injection clock delay circuit includes m*n inverters connected in series.

15. The device of claim 9, wherein the semiconductor memory device is a dynamic random access memory (DRAM).

16. An injection-locked phase-locked loop (ILPLL) circuit, comprising:
a delay-locked loop (DLL) including a phase detector, the phase detector being configured to generate a phase detection signal based on phases of a reference clock and a DLL clock, and the DLL being configured to generate the DLL clock based on the phase detection signal; and
a voltage controlled oscillator configured to generate an output clock based on the DLL clock and an oscillation controlled voltage, the oscillation controlled voltage being generated based on the reference clock and the output clock, and a phase of the output clock being aligned with a phase of the DLL clock.

17. The ILPLL circuit of claim 16, wherein
the phase detector is further configured to generate the phase detection signal based on a comparison between the phases of the reference clock and the DLL clock; and
the DLL further includes
a charge pump and loop filter circuit configured to generate a delay-controlled voltage based on the phase detection signal, and
a voltage-controlled delay line configured to generate the DLL clock by delaying the reference clock based on the delay-controlled voltage.

18. The ILPLL circuit of claim 16, wherein the ILPLL comprises:
a phase frequency detector configured to generate a phase detection signal based on a comparison between phases of the reference clock and the output clock; and
a charge pump and loop filter circuit configured to generate the oscillation-controlled voltage based on the phase detection signal.

19. The ILPLL circuit of claim 16, wherein
the reference clock is a delayed reference clock and the DLL clock is a delayed DLL clock;
the phase detector is configured to generate the phase detection signal based on a comparison between phases of the delayed reference clock and the delayed DLL clock; and
the DLL further includes
a reference clock delay circuit configured to delay the reference clock to generate the delayed reference clock;
an injection clock delay circuit configured to delay the DLL clock to generate the delayed DLL clock;
a charge pump and loop filter circuit configured to generate a delay-controlled voltage based on the phase detection signal; and
a voltage-controlled delay line configured to generate the DLL clock by delaying the reference clock based on the delay-controlled voltage.

20. The ILPLL circuit of claim 16, further comprising:
a reference clock delay circuit configured to delay the reference clock to generate a delayed reference clock;
an output clock delay circuit configured to delay the output clock to generate a delayed output clock;
a phase frequency detector configured to generate a phase detection signal based on a comparison between phases of the delayed reference clock and the delayed output clock; and
a charge pump and loop filter circuit configured to generate the oscillation-controlled voltage based on the phase detection signal.

* * * * *